US010439117B2

(12) United States Patent
Shimabukuro

(10) Patent No.: US 10,439,117 B2
(45) Date of Patent: Oct. 8, 2019

(54) OPTICAL DEVICE

(71) Applicant: ROHM CO., LTD., Kyoto (JP)

(72) Inventor: Riki Shimabukuro, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/002,219

(22) Filed: Jun. 7, 2018

(65) Prior Publication Data

US 2018/0358524 A1 Dec. 13, 2018

(30) Foreign Application Priority Data

Jun. 9, 2017 (JP) ................................ 2017-114141

(51) Int. Cl.

| | |
|---|---|
| ***H01L 33/62*** | (2010.01) |
| ***H01L 23/00*** | (2006.01) |
| ***H01L 23/31*** | (2006.01) |
| ***H01L 25/075*** | (2006.01) |
| ***H01L 33/54*** | (2010.01) |
| ***H01L 33/64*** | (2010.01) |
| ***H01L 33/48*** | (2010.01) |
| ***H01L 33/60*** | (2010.01) |

(52) U.S. Cl.

CPC .............. *H01L 33/62* (2013.01); *H01L 23/31* (2013.01); *H01L 24/97* (2013.01); *H01L 24/29* (2013.01); *H01L 24/48* (2013.01); *H01L 25/0753* (2013.01); *H01L 33/486* (2013.01); *H01L 33/54* (2013.01); *H01L 33/60* (2013.01); *H01L 33/647* (2013.01); *H01L 2224/48227* (2013.01); *H01L 2224/48245* (2013.01); *H01L 2924/00014* (2013.01); *H01L 2924/1033* (2013.01); *H01L 2924/12041* (2013.01); *H01L 2924/181* (2013.01); *H01L 2924/35121* (2013.01); *H01L 2933/005* (2013.01); *H01L 2933/0066* (2013.01); *H01L 2933/0075* (2013.01)

(58) Field of Classification Search

CPC ............ H01L 29/0696; H01L 29/1095; H01L 29/7813; H01L 33/486; H01L 33/62

USPC ........................................................... 257/88

See application file for complete search history.

(56) References Cited

U.S. PATENT DOCUMENTS

2002/0185649 A1* 12/2002 Oshio ................ H01L 25/0753 257/81

2015/0162456 A1* 6/2015 Toyama ............. H01L 31/0203 257/99

FOREIGN PATENT DOCUMENTS

JP 2015-115432 6/2015

* cited by examiner

*Primary Examiner* — Andy Huynh

(74) *Attorney, Agent, or Firm* — Hamre, Schumann, Mueller & Larson, P.C.

(57) ABSTRACT

An optical device includes a substrate, a conductive layer formed over the substrate, an insulating layer formed over the conductive layer, a first optical element disposed over the conductive layer, and a sealing resin part configured to cover the first optical element. The conductive layer includes a first conductive section, a second conductive section spaced apart from the first conductive section, and a first conductive portion extending in a first direction from the first conductive section. The first conductive portion is spaced apart from the second conductive section in a second direction intersecting with the first direction, and the insulating layer includes a first insulating part formed over the first conductive portion, and the first insulating part includes a portion overlapping with the second conductive section in the first direction.

24 Claims, 18 Drawing Sheets

OPTICAL DEVICE

CROSS-REFERENCE TO RELATED APPLICATION(S)

This application is based upon and claims the benefit of priority from Japanese Patent Application No. 2017-114141, filed on Jun. 9, 2017, the entire contents of which are incorporated herein by reference.

TECHNICAL FIELD

The present disclosure relates to an optical device.

BACKGROUND

A conventional semiconductor light-emitting device includes a substrate, an optical element, a wiring pattern, a junction layer, and a sealing resin. The wiring pattern is formed over the substrate. A semiconductor light-emitting element is disposed in the wiring pattern via the junction layer. The sealing resin is disposed over a base material so as to cover the semiconductor light-emitting element and the wiring pattern.

SUMMARY

Some embodiments of the present disclosure provide an optical device capable of preventing an optical element from being desorbed from a conductive layer.

According to one embodiment of the present disclosure, there is provided an optical device, including: a substrate; a conductive layer formed over the substrate; an insulating layer formed over the conductive layer; a first optical element disposed over the conductive layer; and a sealing resin part configured to cover the first optical element, wherein the conductive layer includes a first conductive section, a second conductive section spaced apart from the first conductive section, and a first conductive portion extending in a first direction from the first conductive section, wherein the first conductive portion is spaced apart from the second conductive section in a second direction intersecting with the first direction, and wherein the insulating layer includes a first insulating part formed over the first conductive portion, and the first insulating part includes a portion overlapping with the second conductive section in the first direction.

Other features and advantages of the present disclosure will become more apparent from the detailed description given below with reference to the accompanying drawings.

DETAILED DESCRIPTION

Embodiments of the present disclosure will now be described in detail with reference to the drawings.

First Embodiment

A first embodiment of the present disclosure will be described with reference to FIGS. 1 to 18.

Figure 1:
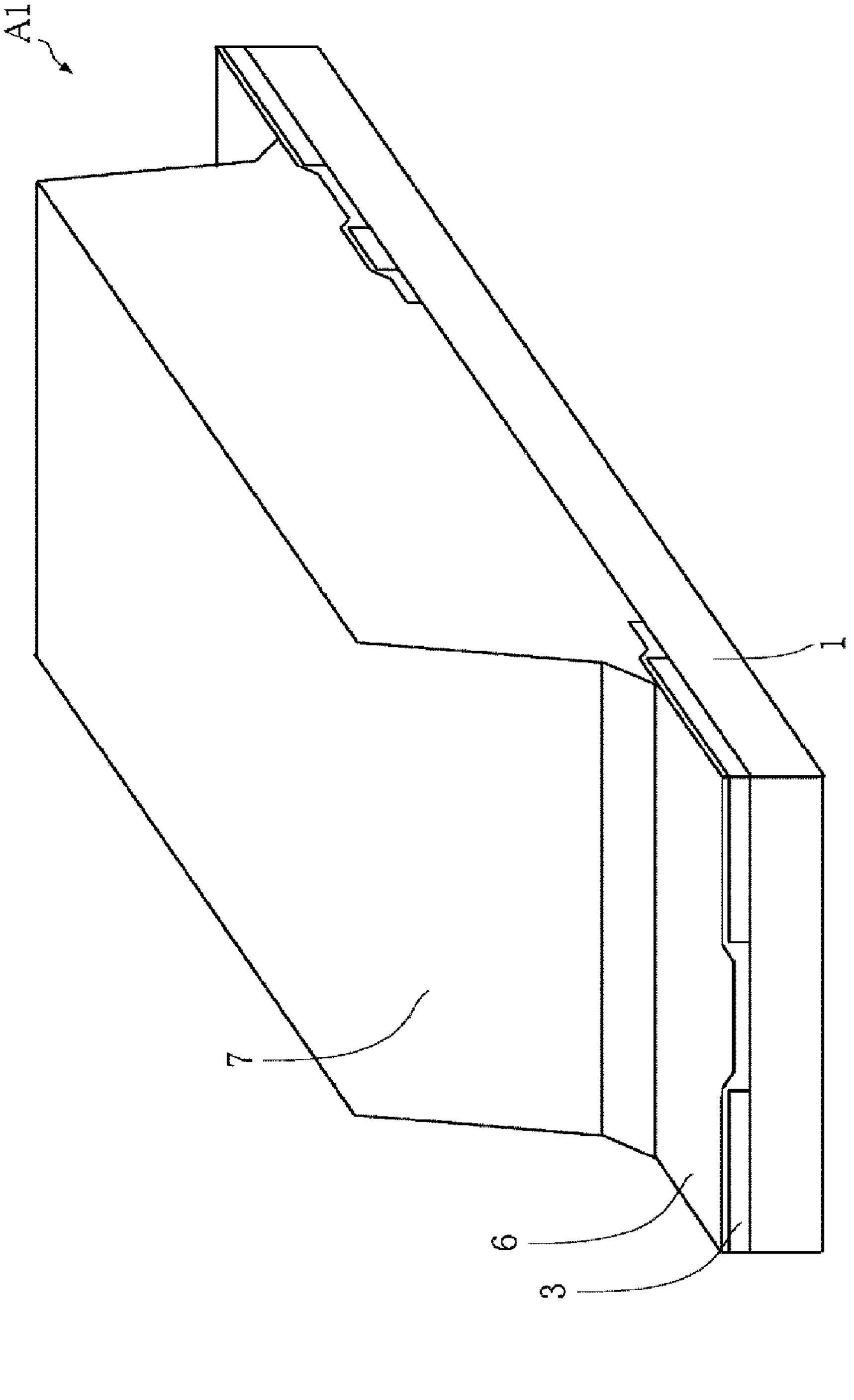
FIG. 1 is a perspective view of an optical device according to a first embodiment of the present disclosure.
Figure 2:
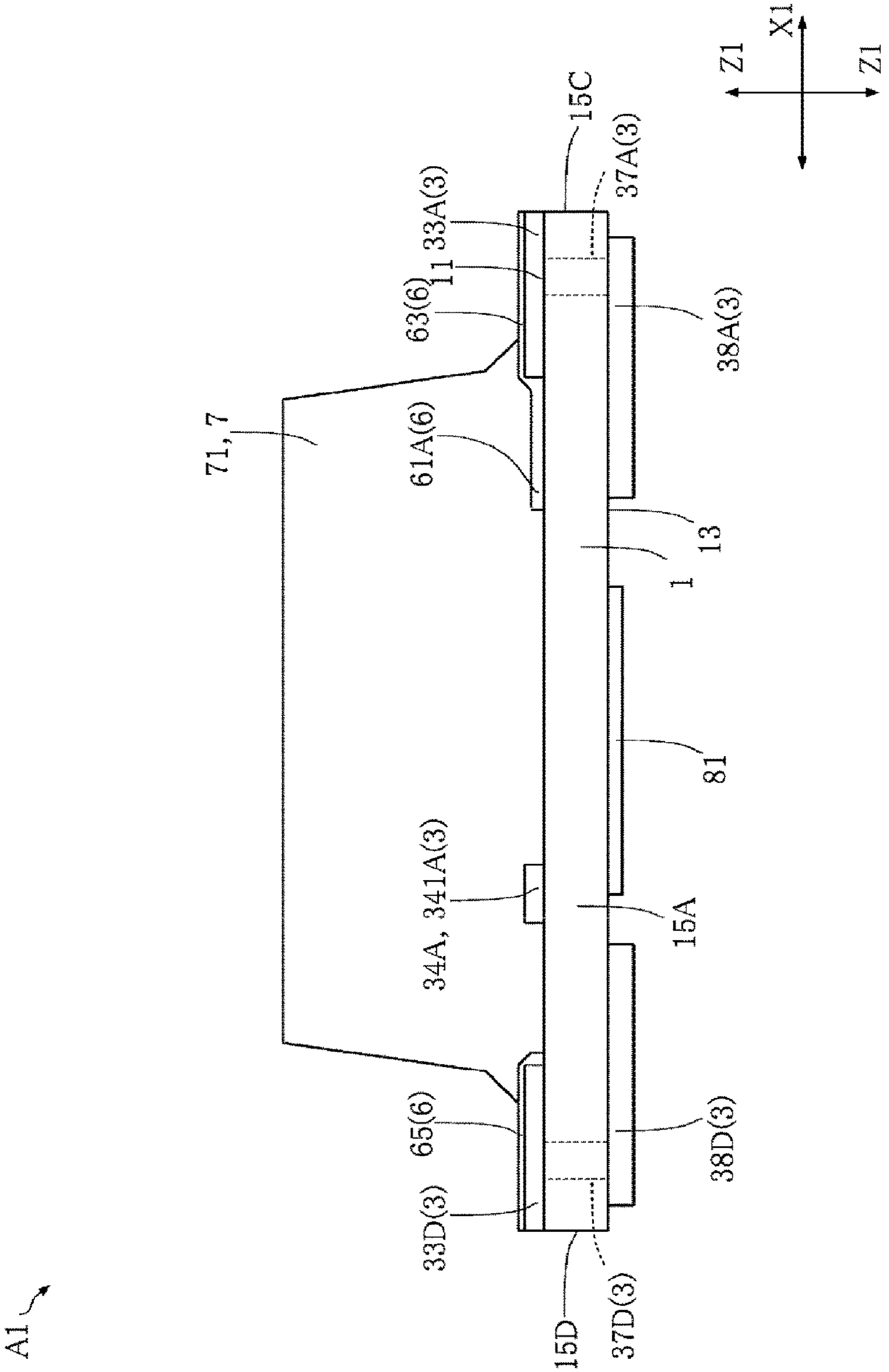
FIG. 2 is a front view of the optical device according to the first embodiment.
Figure 3:
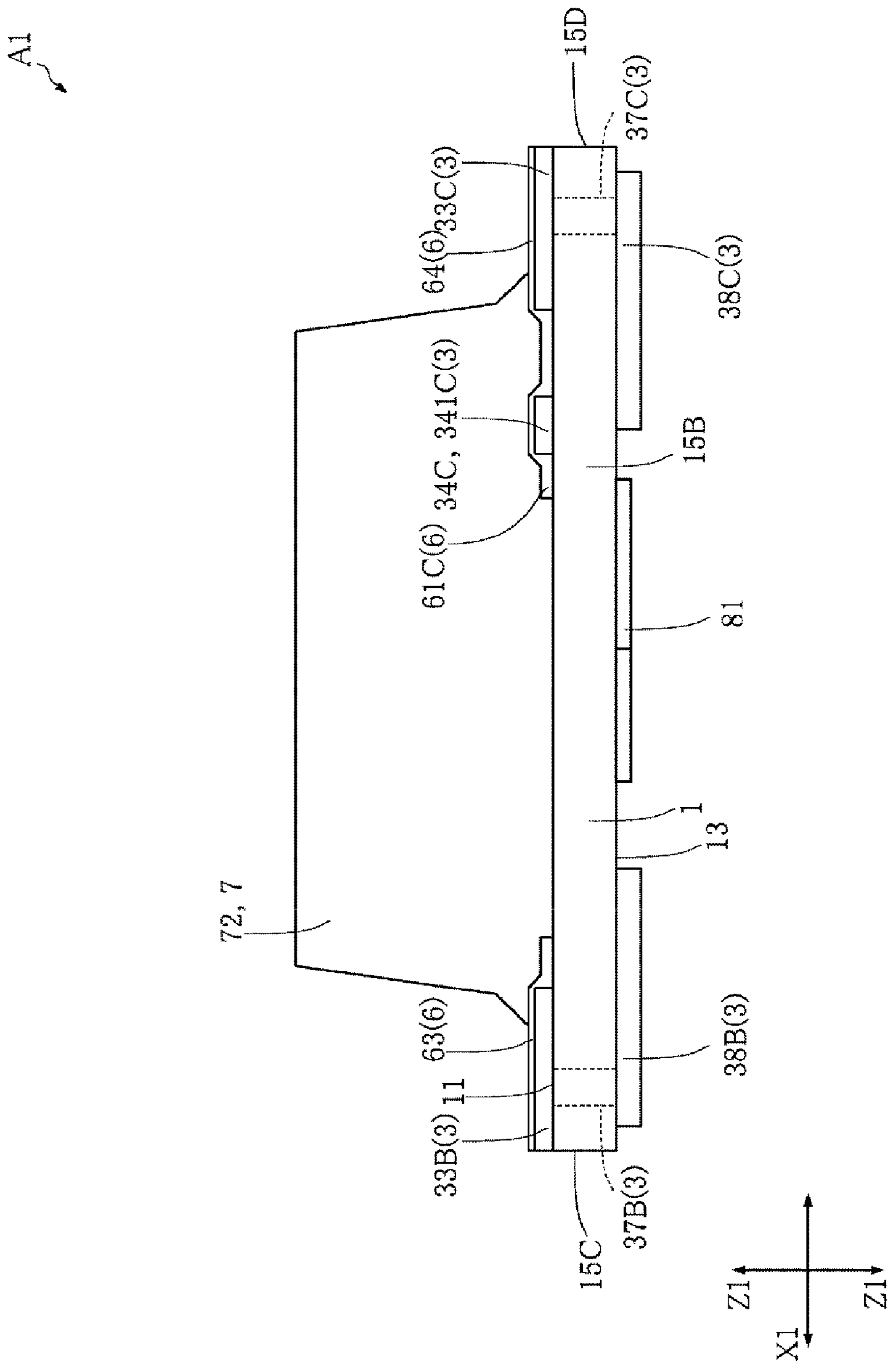
FIG. 3 is a rear view of the optical device according to the first embodiment.
Figure 4:
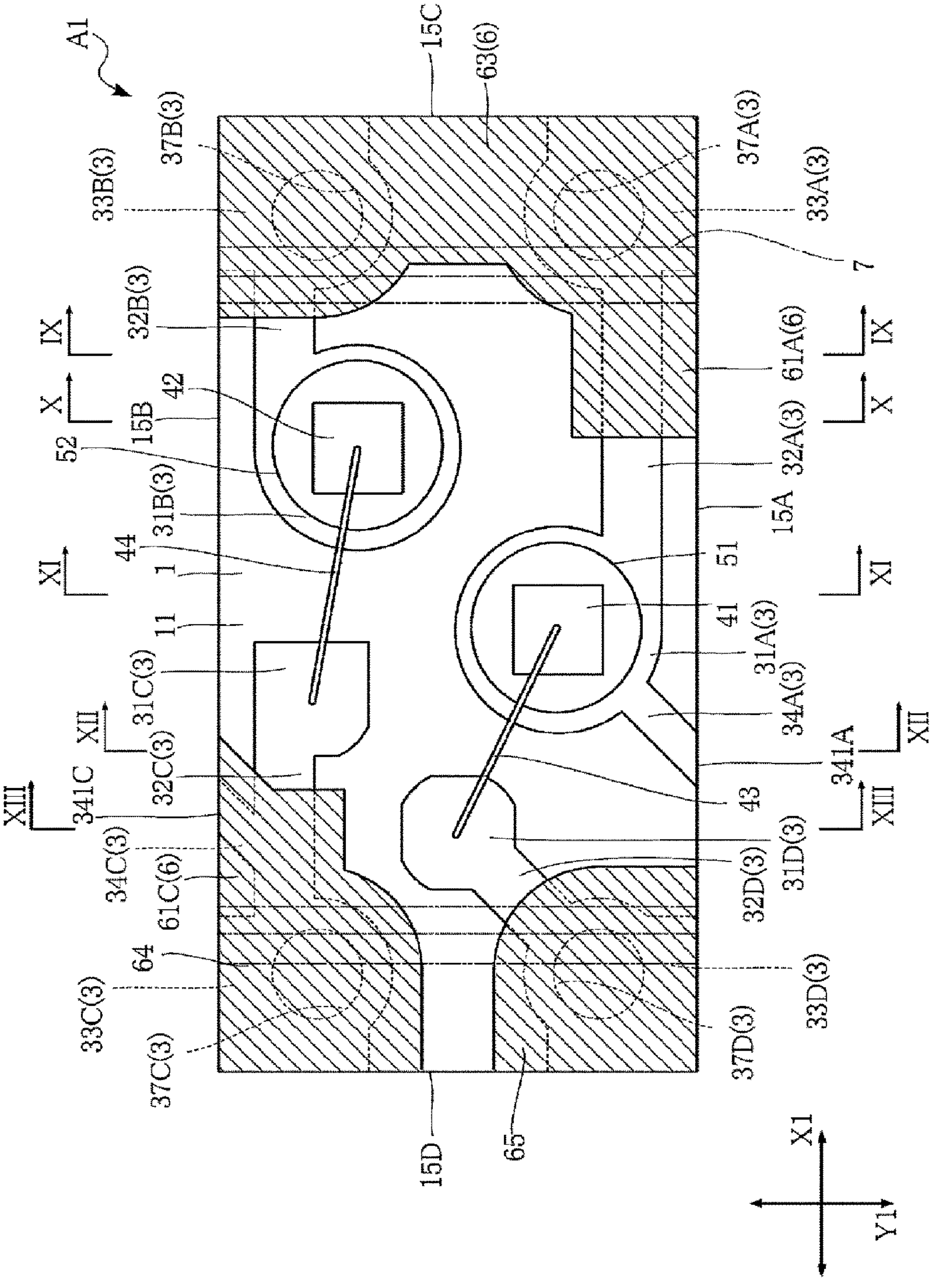
FIG. 4 is a plan view of the optical device according to the first embodiment.

FIG. 1 is a perspective view of an optical device according to a first embodiment of the present disclosure. FIG. 2 is a front view of the optical device according to the first embodiment. FIG. 3 is a rear view of the optical device according to the first embodiment. FIG. 4 is a plan view of the optical device according to the first embodiment.

An optical device A1 illustrated in these drawings includes a substrate 1, a conductive layer 3, a first optical element 41, a second optical element 42, a first wire 43, a second wire 44, a first junction layer 51, a second junction layer 52, an insulating layer 6, and a sealing resin part 7. In FIG. 4, the sealing resin part 7 is represented by a two-dot chain line.

The substrate 1 is made of, for example, an insulating material. Examples of the insulating material may include an insulating resin, ceramic, and the like. Examples of the insulating resin may include an epoxy resin (which may contain, for example, glass or paper), a phenol resin, polyimide, polyester, and the like. Examples of the ceramic may include $Al_2O_3$, SiC, AlN, and the like. The substrate 1 may be one in which an insulating film is formed over a substrate made of metal such as aluminum. The substrate 1 has a rectangular shape as viewed in a thickness direction Z1 of the substrate 1.

The substrate 1 has a main surface 11, a rear surface 13, a first side surface 15A, a second side surface 15B, a third side surface 15C, and a fourth side surface 15D.

The main surface 11 and the rear surface 13 are spaced apart from each other in the thickness direction Z1 of the substrate 1 and face opposite sides. Both the main surface 11 and the rear surface 13 are flat.

The first side surface 15A and the second side surface 15B are spaced apart in a second direction Y1 intersecting with a first direction X1 and face opposite sides. Both the first side surface 15A and the second side surface 15B are connected to the main surface 11 and the rear surface 13. Both the first side surface 15A and the second side surface 15B are flat. In the present embodiment, the first direction X1 and the second direction Y1 are orthogonal but may not be orthogonal. For example, the angle between the first direction X1 and the second direction Y1 may be 60 degrees or 80 degrees.

The third side surface 15C and the fourth side surface 15D are spaced apart in the first direction X1 and face opposite sides. Both the third side surface 15C and the fourth side surface 15D are connected to the main surface 11 and the rear surface 13. Both the third side surface 15C and the fourth side surface 15D are flat.

Figure 5:
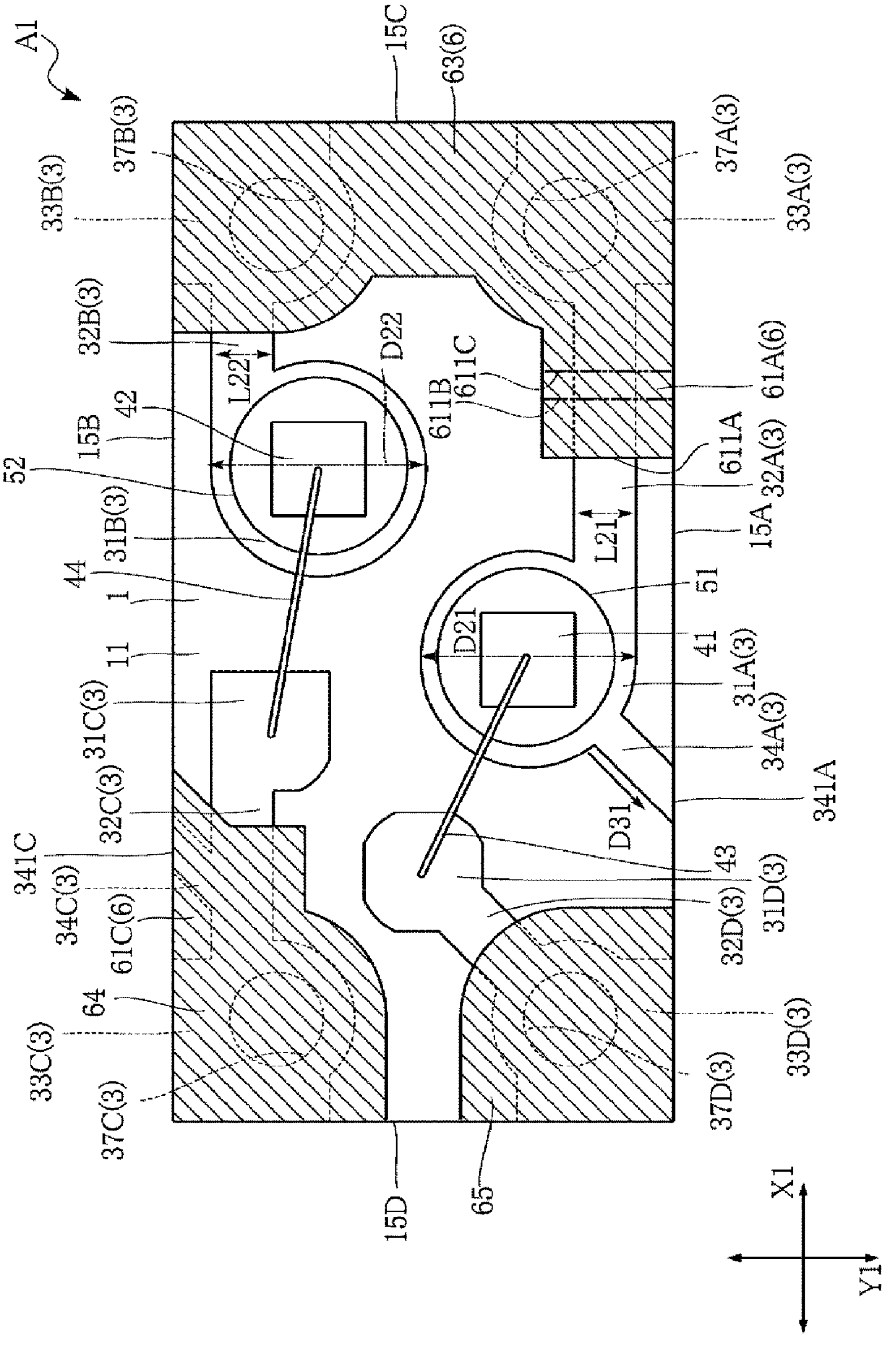
FIG. 5 is a view in which a sealing resin part is omitted from FIG. 4.
Figure 6:
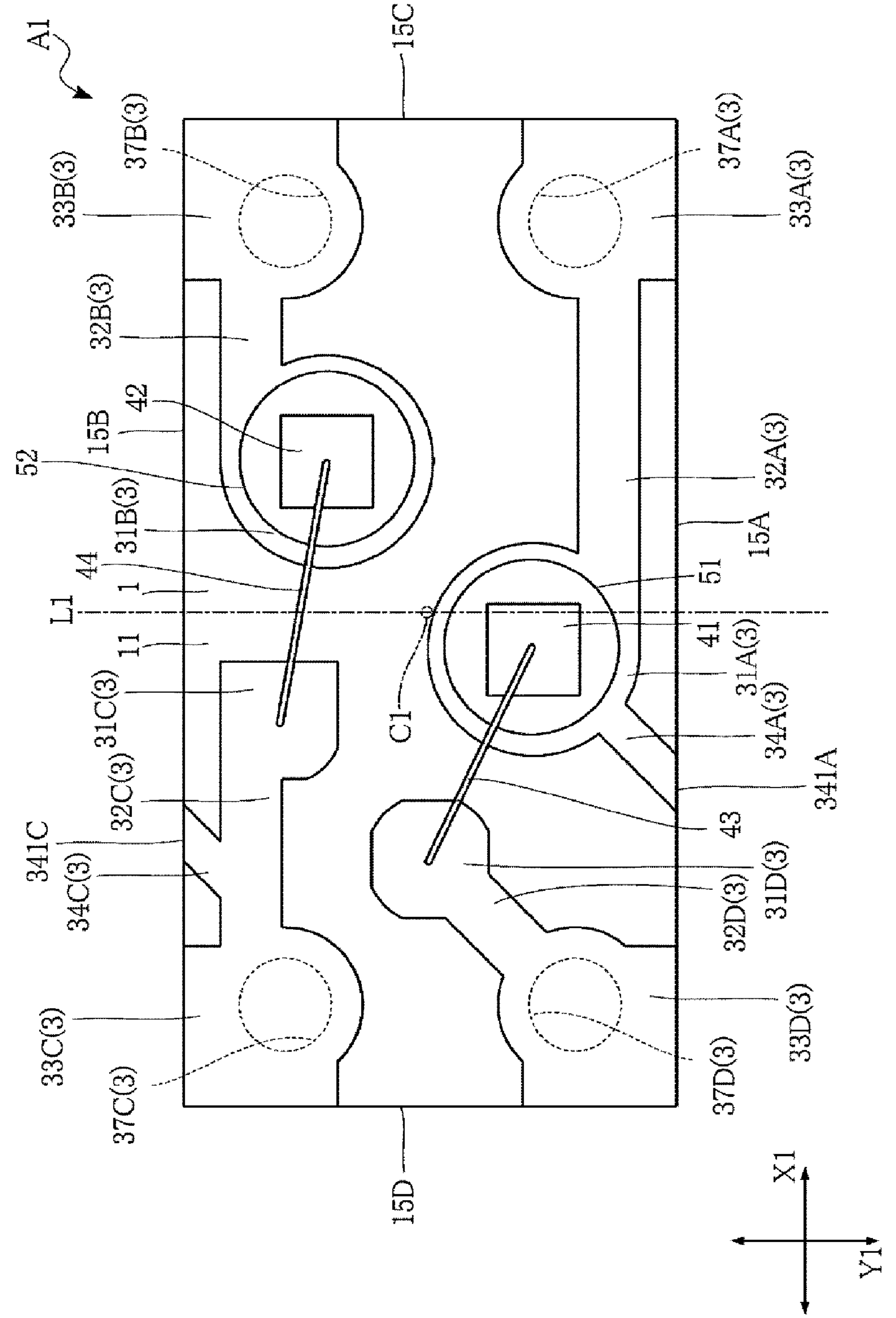
FIG. 6 is a view in which an insulating layer is omitted from FIG. 5.
Figure 7:
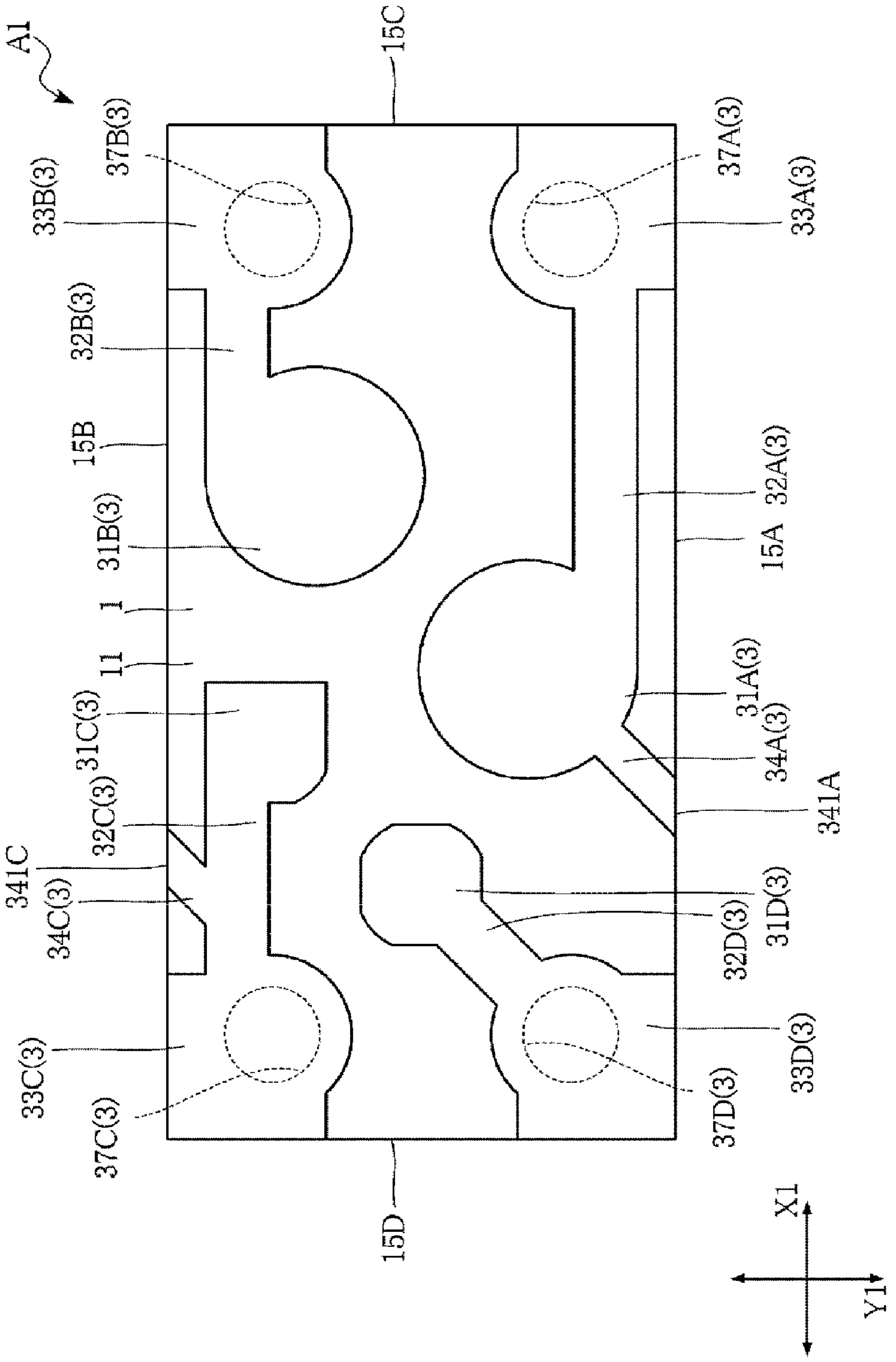
FIG. 7 is a view in which optical elements and wires are omitted from FIG. 6.

FIG. 5 is a view in which the sealing resin part is omitted from FIG. 4. FIG. 6 is a view in which the insulating layer is omitted from FIG. 5. FIG. 7 is a view in which the optical elements and the wires are omitted from FIG. 6.

The conductive layer 3 illustrated in FIGS. 5 to 7 and the like is formed over the substrate 1. The conductive layer 3 forms a current path for supplying electric power to the first optical element 41 and the second optical element 42.

The conductive layer 3 includes a first conductive section 31A, a first conductive portion 32A, a first conductive part 33A, a first additional conductive portion 34A, a second conductive section 31B, a second conductive portion 32B, a second conductive part 33B, a third conductive section 31C, a third conductive portion 32C, a third conductive part 33C, a second additional conductive portion 34C, a fourth conductive section 31D, a fourth conductive portion 32D, a fourth conductive part 33D, a first conductive part 37A, a second conductive part 37B, a third conductive part 37C, a fourth conductive part 37D, a first rear part 38A, a second rear part 38B, a third rear part 38C, and a fourth rear part 38D.

As illustrated in FIG. 6 and the like, the first conductive section 31A, the first conductive portion 32A, the first conductive part 33A, the first additional conductive portion 34A, the second conductive section 31B, the second conductive portion 32B, the second conductive part 33B, the third conductive section 31C, the third conductive portion 32C, the third conductive part 33C, the second additional conductive portion 34C, the fourth conductive section 31D, the fourth conductive portion 32D, and the fourth conductive part 33D are formed over the main surface 11 of the substrate 1.

The first optical element 41 is bonded to the first conductive section 31A. In the present embodiment, a portion of the outer shape of the first conductive section 31A has a circular shape. The circular shape may include a perfect circle and a shape similar to the circle, which may be the same below. Unlike the present embodiment, the first conductive section 31A may not have a circular shape but may have another shape (for example, a rectangular shape). The rectangular shape may include a perfect rectangle and a shape similar to the rectangle, which may be the same below.

The first conductive portion 32A extends in the first direction X1 from the first conductive section 31A. An edge of the first conductive portion 32A in the second direction Y1 and an edge of the first conductive section 31A in the second direction Y1 are continuously connected. The first conductive portion 32A is spaced apart from the second conductive section 31B in the second direction Y1 intersecting with the first direction X1. In the present embodiment, a width L21 (a dimension in the second direction Y1 in this embodiment, see FIG. 5) of the first conductive portion 32A is smaller than a diameter D21 of the first conductive section 31A.

The first conductive part 33A is connected to the first conductive portion 32A. The first conductive part 33A is formed near one of four corners of the main surface 11 of the substrate 1. Specifically, the first conductive part 33A is in contact with the first side surface 15A and the third side surface 15C as viewed in the thickness direction Z1.

The first additional conductive portion 34A extends from the first conductive section 31A. The first additional conductive portion 34A reaches the first side surface 15A as viewed in the thickness direction Z1 of the substrate 1. The first additional conductive portion 34A extends in a different direction D31 different from the first direction X1 and the second direction Y1 as viewed in the thickness direction Z1 of the substrate 1 (see FIG. 5). The first additional conductive portion 34A is exposed from the insulating layer 6. As illustrated in FIG. 5 and the like, the first additional conductive portion 34A has a first outer side surface 341A that is flush with the first side surface 15A.

The second conductive section 31B is spaced apart from the first conductive section 31A. The second optical element 42 is bonded to the second conductive section 31B. In the present embodiment, the second conductive section 31B has a circular shape. Unlike the present embodiment, the second conductive section 31B may not have a circular shape but may have another shape (for example, a rectangular shape).

The second conductive portion 32B extends in the first direction X1 from the second conductive section 31B. In the present embodiment, a width L22 (a dimension in the second direction Y1 in this embodiment) of the second conductive portion 32B is smaller than a diameter D22 of the second conductive section 31B.

A second conductive part 33B is connected to the second conductive portion 32B. The second conductive part 33B is formed near one of the four corners of the main surface 11 of the substrate 1. Specifically, the second conductive part 33B is in contact with the second side surface 15B and the third side surface 15C as viewed in the thickness direction Z1. The second conductive part 33B is spaced apart from the first conductive part 33A in the second direction Y1

In the present embodiment, the third conductive section 31C is spaced apart from the first conductive section 31A and the second conductive section 31B. The third conductive section 31C has a rectangular shape. Unlike the present embodiment, the third conductive section 31C may not have a rectangular shape but may have another shape (for example, a circular shape).

The third conductive portion 32C extends from the third conductive section 31C to an opposite side of the second conductive section 31B. The third conductive portion 32C and the fourth conductive section 31D are spaced apart in the second direction Y1.

The third conductive part 33C is connected to the third conductive portion 32C. The third conductive part 33C is formed near one of the four corners of the main surface 11 of the substrate 1. Specifically, the third conductive part 33C is in contact with the second side surface 15B and the fourth side surface 15D as viewed in the thickness direction Z1.

The second additional conductive portion 34C extends from the third conductive section 31C or the third conductive portion 32C. In the present embodiment, the second additional conductive portion 34C extends from the third conductive portion 32C. Unlike the present embodiment, the second additional conductive portion 34C may extend from the third conductive section 31C. The second additional conductive portion 34C reaches the second side surface 15B as viewed in the thickness direction Z1 of the substrate 1. The second additional conductive portion 34C extends in a direction different from the first direction X1 and the second direction Y1 as viewed in the thickness direction Z1 of the substrate 1. In the present embodiment, the second additional conductive portion 34C extends in the same direction as the extending direction of the first additional conductive portion 34A in the thickness direction Z1 of the substrate 1. In the present embodiment, the second additional conductive portion 34C is exposed from the insulating layer 6. As illustrated in FIG. 5 and the like, the second additional conductive portion 34C has a second outer side surface 341C that is flush with the second side surface 15B. In the present embodiment, as illustrated in FIG. 6, both the second outer side surface 341C of the second additional conductive portion 34C and the first outer side surface 341A of the first additional conductive portion 34A are located on the same side as viewed in the thickness direction Z1 (on the left side in FIG. 6), with respect to a virtual line L1. The virtual line L1 extends along the second direction Y1 and passes through the center C1 of the substrate 1 as viewed in the thickness direction Z1.

In the present embodiment, the fourth conductive section 31D is spaced apart from the first conductive section 31A, the second conductive section 31B, and the third conductive section 31C. The fourth conductive section 31D has a circular shape. Unlike the present embodiment, the fourth conductive section 31D may not have a rectangular shape but may have another shape (for example, a circular shape).

The fourth conductive portion 32D extends from the fourth conductive section 31D to an opposite side of the third conductive section 31C.

The fourth conductive part 33D is connected to the fourth conductive portion 32D. The fourth conductive part 33D is formed near one of the four corners of the main surface 11 of the substrate 1. Specifically, the fourth conductive part 33D is in contact with the first side surface 15A and the fourth side surface 15D as viewed in the thickness direction Z1.

Figure 8:
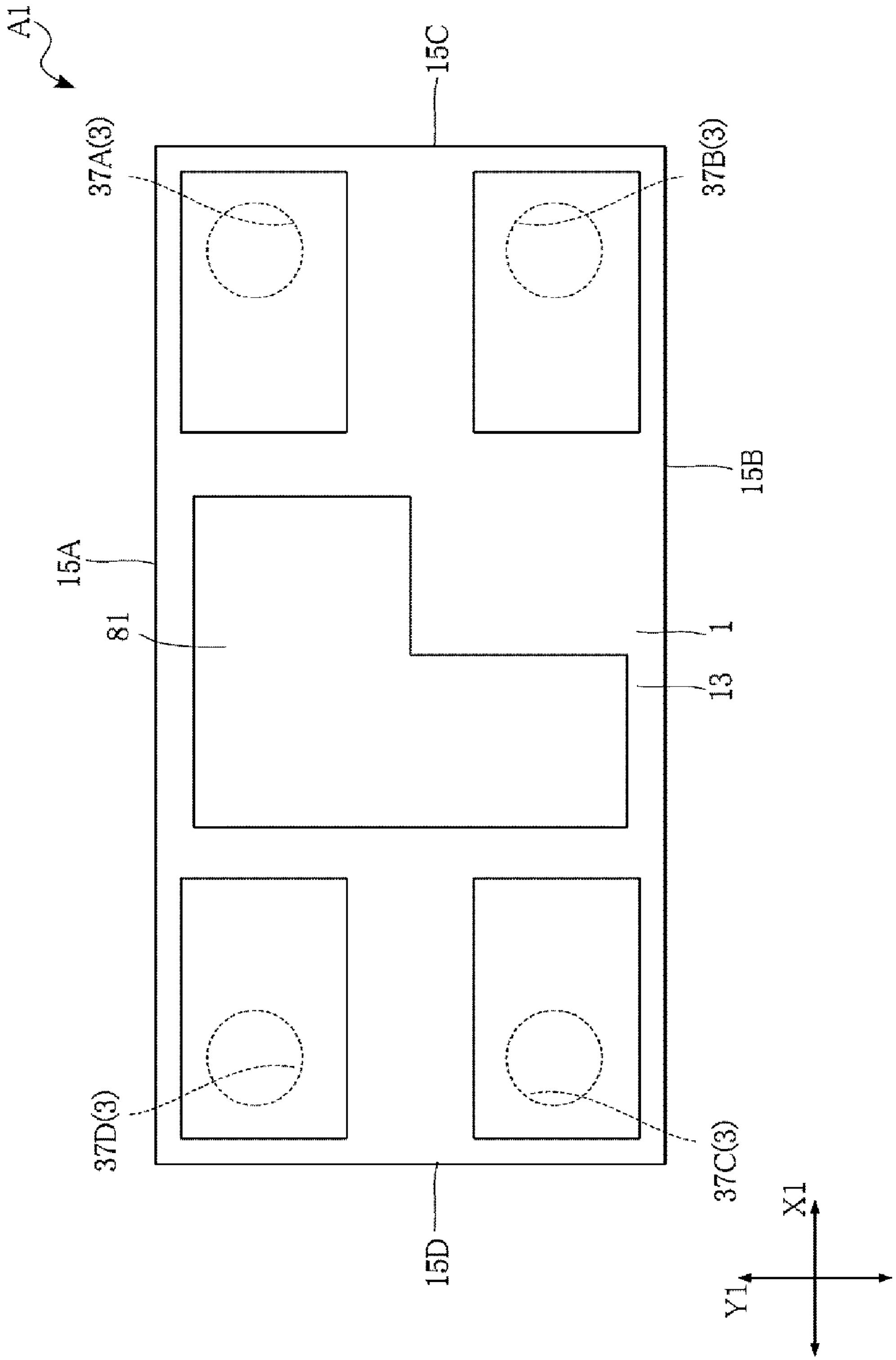
FIG. 8 is a bottom view of the optical device according to the first embodiment.

FIG. 8 is a bottom view of the optical device according to the first embodiment.

As illustrated in FIG. 8, the first rear part 38A, the second rear part 38B, the third rear part 38C, and the fourth rear part 38D are all formed over the rear surface 13. The first rear part 38A, the second rear part 38B, the third rear part 38C, and the fourth rear part 38D are spaced apart from one another. In the present embodiment, the first rear part 38A, the second rear part 38B, the third rear part 38C, and the fourth rear part 38D have a rectangular shape. As illustrated in FIG. 8, an insulating layer 81 for determining a direction of the optical device A1 is formed over the rear surface 13. The first rear part 38A, the second rear part 38B, the third rear part 38C, and the fourth rear part 38D are all mounting terminals for arranging the optical device A1 on the mounting substrate.

The first conductive part 37A, the second conductive part 37B, the third conductive part 37C, and the fourth conductive part 37D illustrated in FIGS. 5 and 6 and the like are formed in four through holes formed in the substrate 1, respectively. The first conductive part 37A is connected to the first conductive section 31A and the first rear part 38A. The second conductive part 37B is connected to the second conductive section 31B and the second rear part 38B. The third conductive part 37C is connected to the third conductive section 31C and the third rear part 38C. The fourth conductive part 37D is connected to the fourth conductive section 31D and the fourth rear part 38D.

Figure 9:
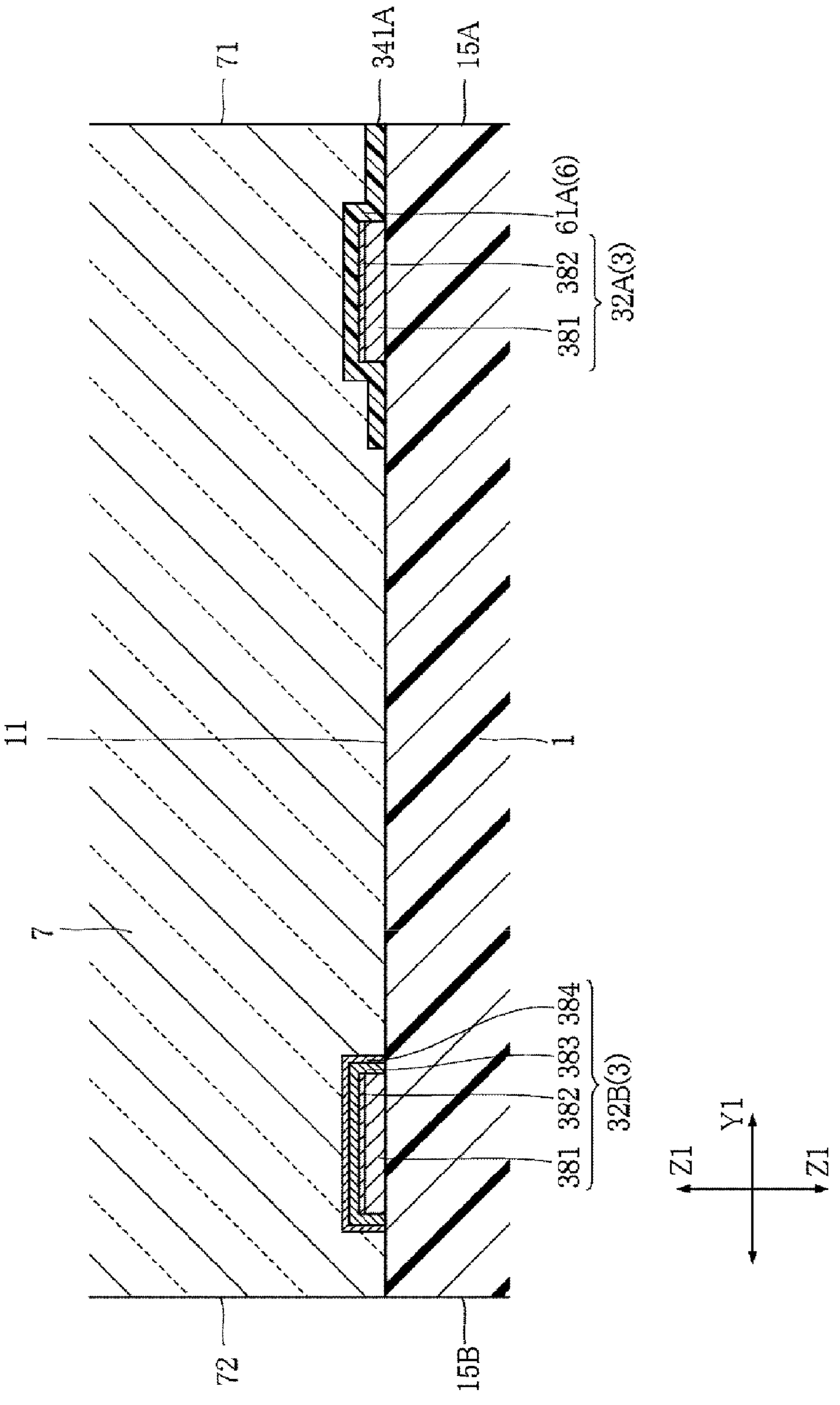
FIG. 9 is a cross-sectional view taken along line IX-IX in FIG. 4.
Figure 10:
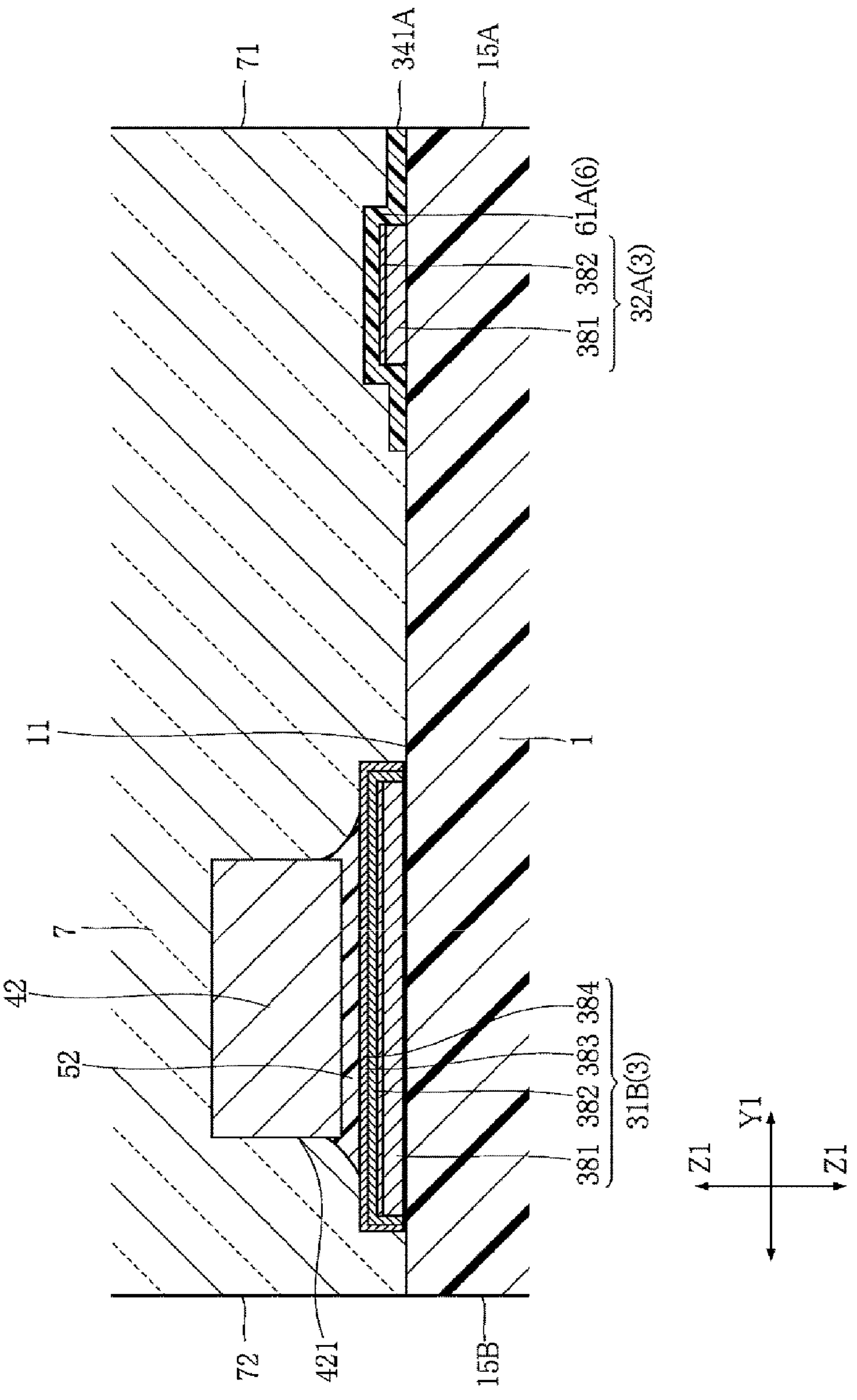
FIG. 10 is a cross-sectional view taken along line X-X in FIG. 4.
Figure 11:
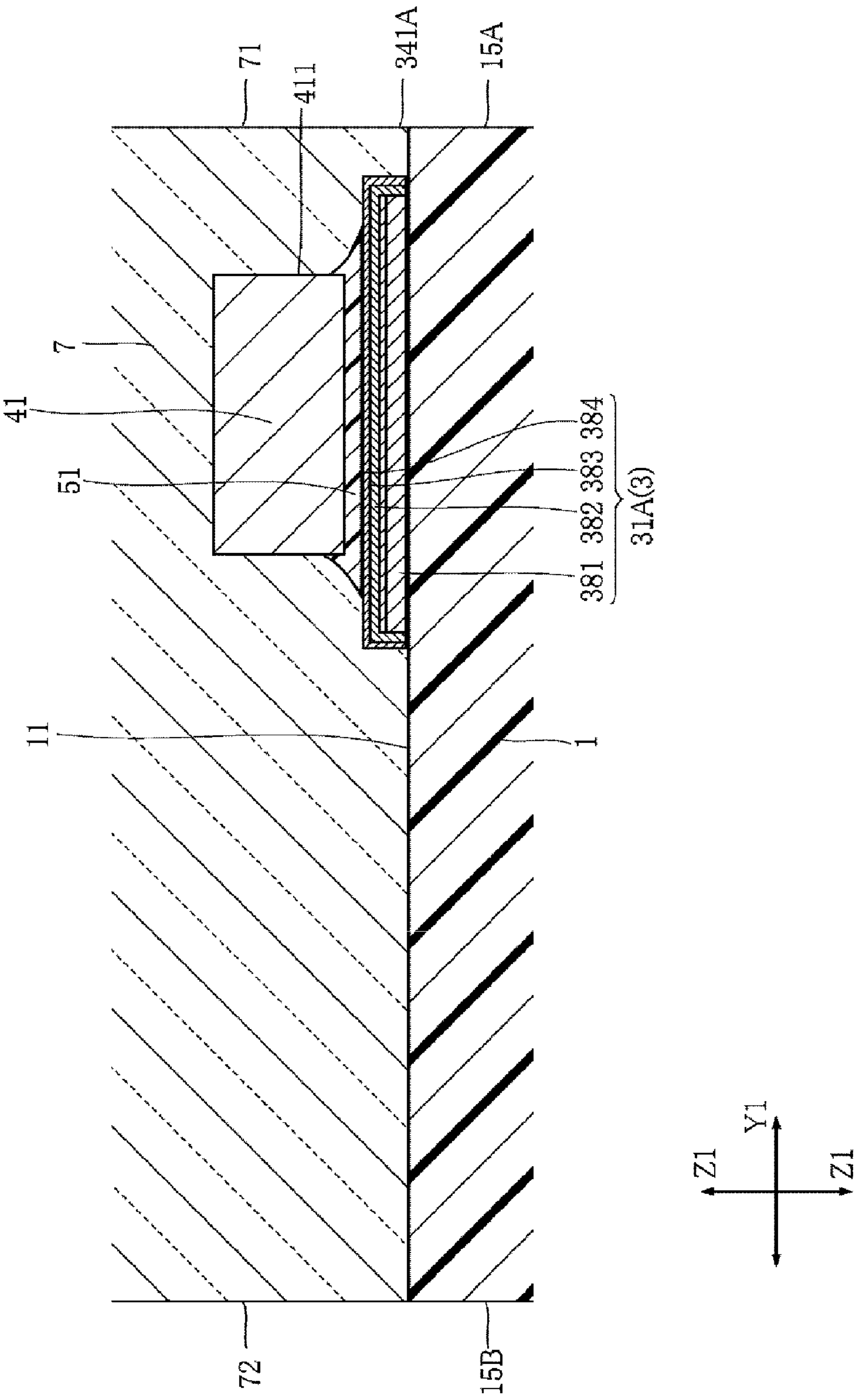
FIG. 11 is a cross-sectional view taken along line XI-XI in FIG. 4.
Figure 12:
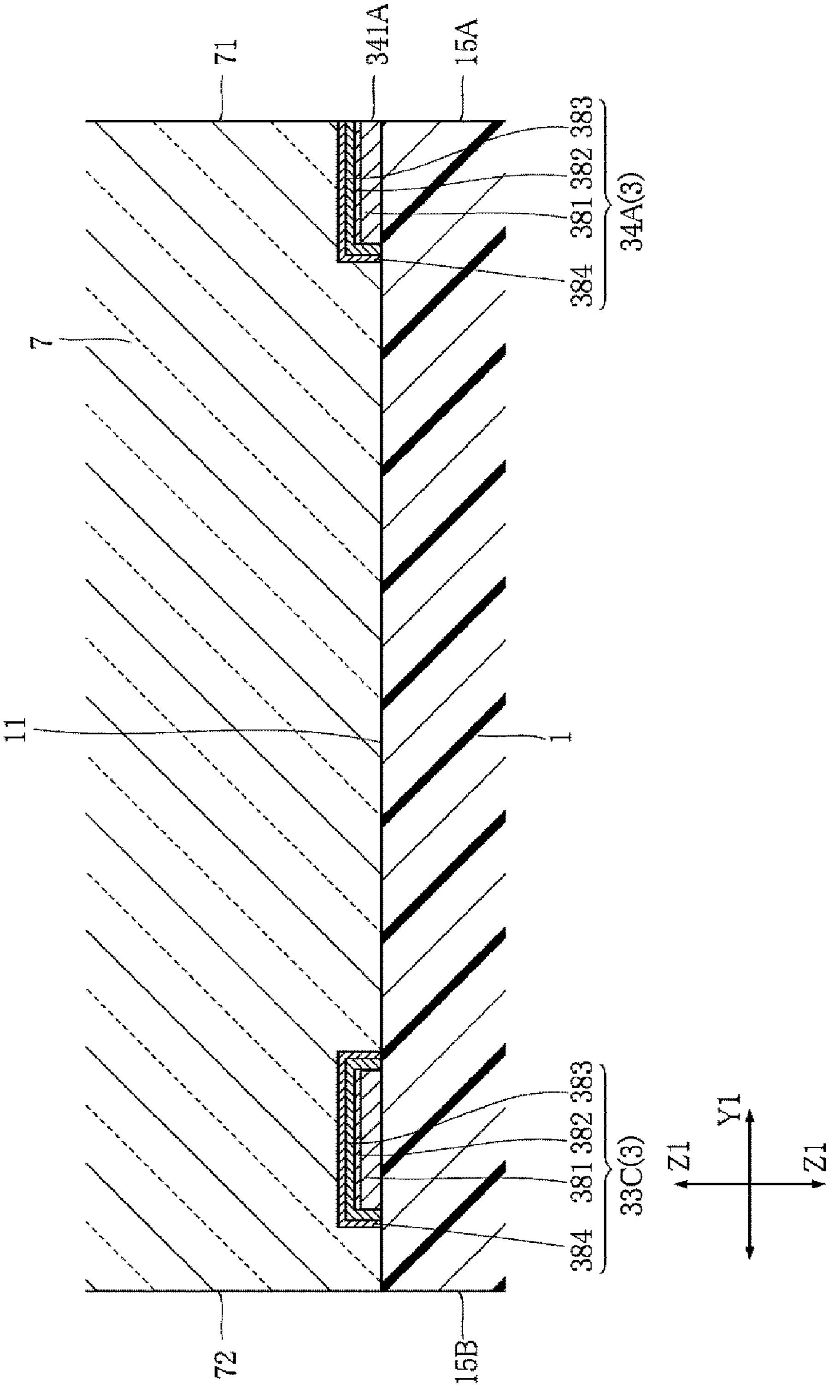
FIG. 12 is a cross-sectional view taken along line XII-XII in FIG. 4.
Figure 13:
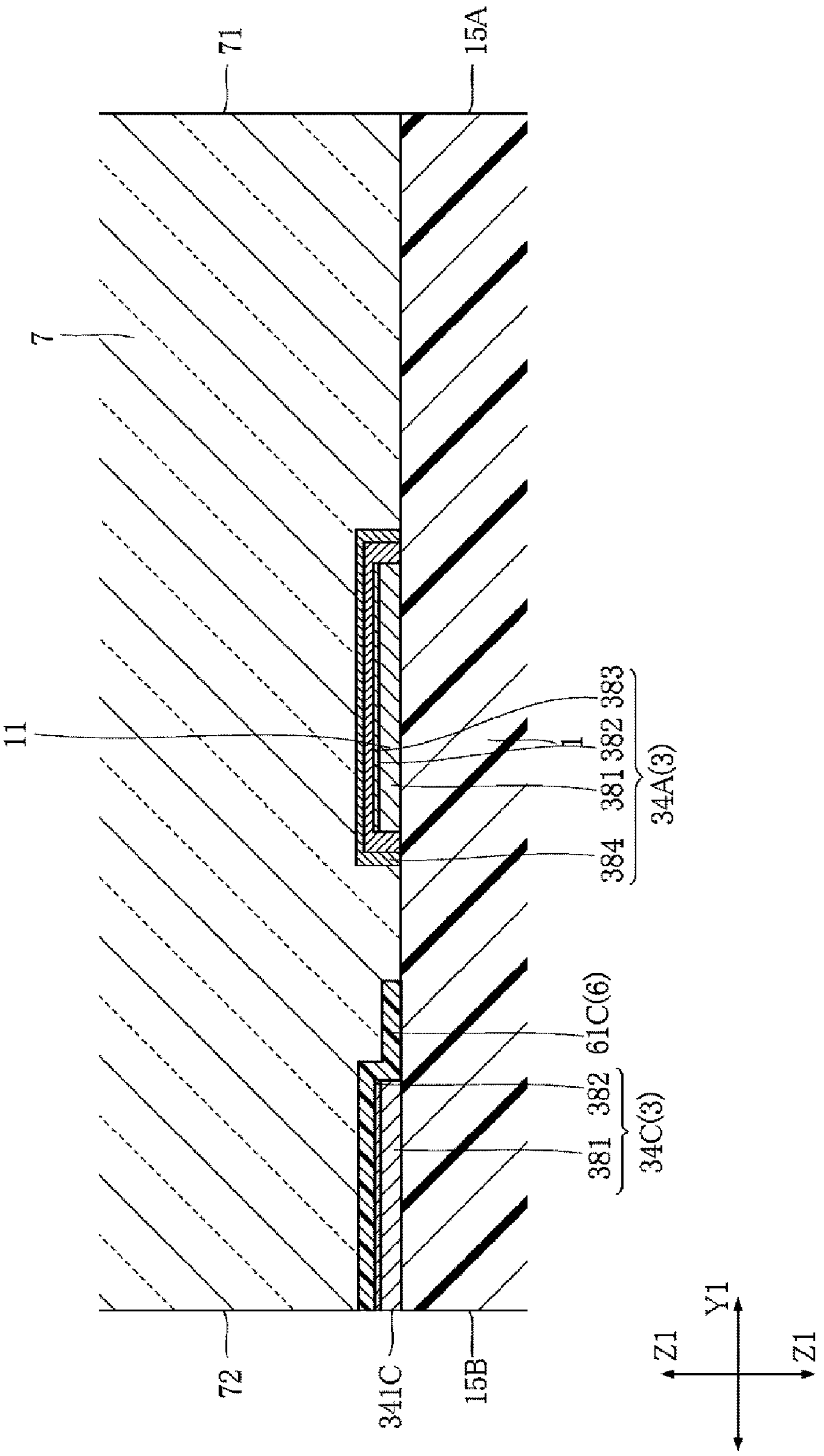
FIG. 13 is a cross-sectional view taken along line XIII-XIII in FIG. 4.

FIG. 9 is a cross-sectional view taken along line IX-IX in FIG. 4. FIG. 10 is a cross-sectional view taken along line X-X in FIG. 4. FIG. 11 is a cross-sectional view taken along line XI-XI in FIG. 4. FIG. 12 is a cross-sectional view taken along line XII-XII in FIG. 4. FIG. 13 is a cross-sectional view taken along line XIII-XIII in FIG. 4.

The conductive layer 3 is made of a single type of metal or plural types of metals such as, for example, Cu, Ni, Ti, Au, or Ag. As illustrated in FIGS. 9 to 13, in the present embodiment, the conductive layer 3 includes a section 381 and sections 382 to 384. The sections 382 to 384 may be formed by plating, or may be formed by sputtering or chemical vapor deposition (CVD).

The section 381 is made of, for example, Cu. The section 381 is directly formed over the main surface 11 and the rear surface 13 of the substrate 1. The section 381 may contain Cu and material other than Cu.

Figure 14:
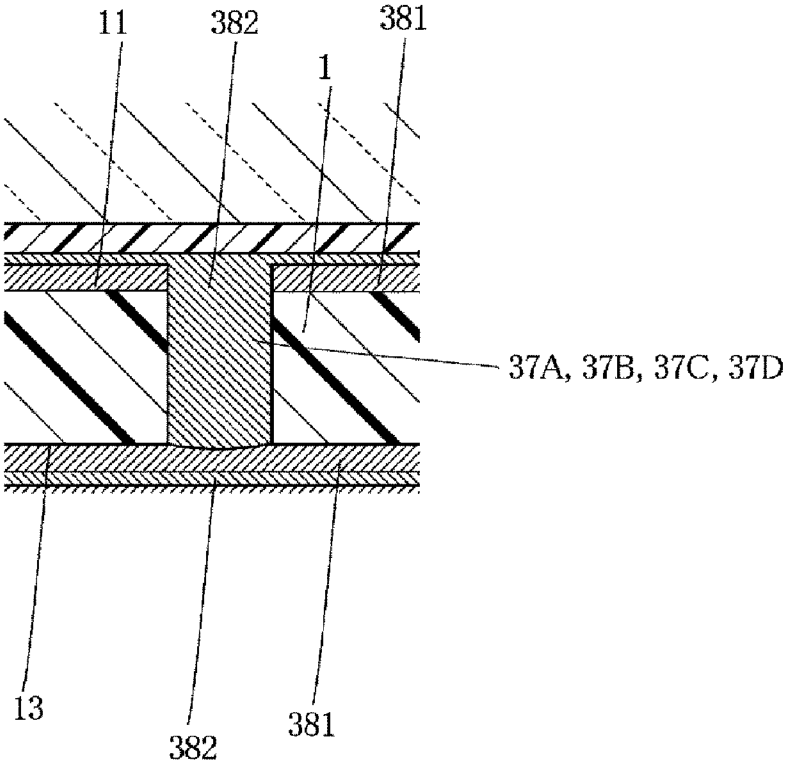
FIG. 14 is a partially enlarged cross-sectional view of a substrate according to the first embodiment.

The section 382 is made of, for example, Cu. The section 382 is formed over the section 381. In the present embodiment, particularly, the section 382 is directly formed over the section 381. Unlike the present embodiment, the section 382 may not be directly formed over the section 381, and another section may be interposed between the section 381 and the section 382. The section 382 electrically connects the section 381 formed over the main surface 11 and the section 381 formed over the rear surface 13. As illustrated in FIG. 14, the section 382 forms the first conductive part 37A, the second conductive part 37B, the third conductive part 37C, and the fourth conductive part 37D. FIG. 14 illustrates an example of a case where the through hole in the substrate 1 is formed by a laser. Unlike the example illustrated in FIG. 14, the through holes in the substrate 1 may be formed by drilling. As illustrated in FIGS. 9 and 10 and the like, the section 382 is formed at any of a region covered with the insulating layer 6 and a region exposed from the insulating layer 6 in the conductive layer 3. In other words, the section 382 is formed over all the regions of the conductive layer 3 illustrated in FIG. 4 as viewed in the thickness direction Z1.

The section 383 is made of, for example, Ni. The section 383 is formed over the section 382. In the present embodiment, particularly, the section 383 is directly formed over the section 382. Unlike the present embodiment, the section 383 may not be directly formed over the section 382, and another section may be interposed between the section 383 and the section 382. The section 384 is made of, for example, Au. The section 384 is formed over the section 383. In the present embodiment, particularly, the section 384 is directly formed over the section 383. Unlike the present embodiment, the section 384 may not be directly formed over the section 383, and another section may be interposed between the section 384 and the section 383. As illustrated in FIGS. 9 and 10 and the like, the sections 383 and 384 are formed at the region exposed from the insulating layer 6 in the conductive layer 3, but is not formed at the region covered with the insulating layer 6.

The insulating layer 6 illustrated in FIG. 5 and the like is made of a material having insulating properties. The insulating layer 6 may be, for example, referred to as a resist layer. The insulating layer 6 is made of, for example, resin (polymer). The insulating layer 6 is made of a translucent material or a non-transparent material. The insulating layer 6 is formed over the main surface 11 and the conductive layer 3. As illustrated in FIGS. 9 and 10 and the like, the insulating layer 6 is interposed between the substrate 1 and the sealing resin part 7 and is in contact with the substrate 1 and the sealing resin part 7.

The insulating layer 6 illustrated in FIG. 5 and the like includes a first insulating part 61A, a second insulating part 61C, and portions 63 to 65.

The first insulating part 61A is formed over the first conductive portion 32A. The first insulating part 61A has a portion overlapping with the second conductive section 31B in the first direction X1. More preferably, the first insulating part 61A has a portion overlapping with the second junction layer 52 in the first direction X1. More preferably, the first insulating part 61A has a portion overlapping with the second optical element 42 in the first direction X1. Preferably, an edge 611A (see FIG. 5) of the first insulating part 61 A is located closer to the first direction X1 side than the first conductive section 31A. As illustrated in FIG. 5, the edge 611A may be located at a position overlapping with the second optical element 42 in the first direction X1. Alternatively, as indicated by the virtual line (two-dot chain line) in FIG. 5, the edge of the first insulating part 61A may be located at a position 611B. The position 611B is located closer to the first direction X1 side than the second optical element 42 and overlaps with the second junction layer 52 in the first direction X1. Alternatively, as indicated by the virtual line (two-dot chain line) in FIG. 5, the edge of the first insulating part 61A may be located at a position 611C. The position 611C is located closer to the first direction X1 side than the second junction layer 52 and overlaps with the second conductive section 31B in the first direction X1.

The second insulating part 61C is formed over the third conductive portion 32C. The second insulating part 61C has a portion overlapping with the fourth conductive section 31D in the first direction X1. More preferably, the second insulating part 61C has a portion overlapping with the first wire 43 in the first direction X1. The second insulating part 61C is formed over the second additional conductive portion 34C.

The portion 63 is formed over the first conductive part 33A and the second conductive part 33B. The portion 63 is connected to the first insulating part 61A. The portion 63 is in contact with the first side surface 15A, the second side surface 15B, and the third side surface 15C as viewed in the thickness direction Z1. The portion 64 is formed over the third conductive part 33C. The portion 64 is in contact with the second side surface 15B and the fourth side surface 15D as viewed in the thickness direction Z1. The portion 64 is connected to the second insulating part 61C. The portion 65 is formed over the fourth conductive part 33D. The portion 65 is in contact with the first side surface 15A and the fourth side surface 15D as viewed in the thickness direction Z1.

The first optical element 41 illustrated in FIG. 5 and the like is bonded to (disposed over) the first conductive section 31A of the conductive layer 3. The second optical element 42 is bonded to (disposed over) the second conductive section 31B of the conductive layer 3. In the present embodiment, each of the first optical element 41 and the second optical element 42 is a light-emitting element or a light-receiving element. In the present embodiment, each of the first optical element 41 and the second optical element 42 serves as a light source of the optical device A1 which is a light-emitting element. In the present embodiment, each of the first optical element 41 and the second optical element 42 is also an LED chip. In the present embodiment, each of the first optical element 41 and the second optical element 42 has an n-type semiconductor layer, an active layer, and a p-type semiconductor layer. The n-type semiconductor layer is laminated on the active layer. The active layer is laminated on the p-type semiconductor layer. Therefore, the active layer is located between the n-type semiconductor layer and the p-type semiconductor layer. The n-type semiconductor layer, the active layer, and the p-type semiconductor layer are made of, for example, GaN. Each of the first optical element 41 and the second optical element 42 has a main surface electrode pad and a rear surface electrode pad which face opposite sides. Illustration of these main surface electrode pad and rear surface electrode pad is omitted. The emission color of each of the first optical element 41 and the second optical element 42 is not particularly limited. The emission colors of the first optical element 41 and the second optical element 42 may be different or may be the same.

The first wire 43 illustrated in FIG. 5 and the like is bonded to the first optical element 41 and the fourth conductive section 31D. The first wire 43 is made of a conductive material. The first wire 43 electrically connects the first optical element 41 and the fourth conductive section 31D.

The second wire 44 illustrated in FIG. 5 and the like is bonded to the second optical element 42 and the third conductive section 31C. The second wire 44 is made of a conductive material. The second wire 44 electrically connects the second optical element 42 and the third conductive section 31C.

The first junction layer 51 illustrated in FIG. 5 and the like is interposed between the first optical element 41 and the conductive layer 3 (specifically, the first conductive section 31A). In the present embodiment, the first junction layer 51 is made of a conductive material. The first junction layer 51 is derived from, for example, a silver paste. Unlike the present embodiment, the first junction layer 51 may be made of an insulating material. As illustrated in FIG. 11, a portion of the first junction layer 51 may be on the side surface 411 of the first optical element 41, and the first junction layer 51 may be in contact with the side surface 411 of the first optical element 41. Unlike the present embodiment, the first junction layer 51 may not be on the side surface of the first optical element 41.

The second junction layer 52 illustrated in FIG. 5 and the like is interposed between the second optical element 42 and the conductive layer 3 (specifically, the second conductive section 31B). In the present embodiment, the second junction layer 52 is made of a conductive material. The second junction layer 52 is derived from, for example, a silver paste. Unlike the present embodiment, the second junction layer 52 may be made of an insulating material. As illustrated in FIG. 10, a portion of the second junction layer 52 may be on the side surface 421 of the second optical element 42, and the second junction layer 52 may be in contact with the side surface 421 of the second optical element 42. Unlike the present embodiment, the second junction layer 52 may not be on the side surface of the second optical element 42.

The sealing resin part 7 illustrated in FIGS. 9 and 10 and the like covers the substrate 1, the first optical element 41, the second optical element 42, the conductive layer 3, the insulating layer 6, the first wire 43, and the second wire 44. In the present embodiment, the sealing resin part 7 is made of resin that transmits light. Examples of this resin may include transparent or translucent epoxy resin, silicone resin, acrylic resin, polyvinyl resin, and the like. The sealing resin part 7 may be one which includes a fluorescent material that emits light having a different wavelength by being excited by light from the first optical element 41. In the present embodiment, unlike the case where the resin part is a so-called black resin, no filler is mixed in the sealing resin part 7.

The sealing resin part 7 is formed by molding. The sealing resin part 7 is smaller than the substrate 1 in the direction X1. In the present embodiment, the sealing resin part 7 has a truncated quadrangular pyramid shape. The sealing resin part 7 is not limited to a truncated quadrangular pyramid shape but may be a hemispherical shape protruding in the thickness direction Z1 of the substrate 1 or may have a recess surface on the front side in the thickness direction Z1 of the substrate 1. Unlike the present embodiment, a reflector surrounding the sealing resin part 7 and the first optical element 41 may be disposed over the substrate 1. Unlike the present embodiment, the shape of the sealing resin part 7 in the thickness direction Z1 may be the same as the shape of the substrate 1 in the thickness direction Z1.

As illustrated in FIGS. 12 and 13, the sealing resin part 7 includes a first outer side surface 71 and a second outer side surface 72. As illustrated in FIG. 12, the first outer side surface 71 is flush with the first outer side surface 341A of the first additional conductive portion 34A. As illustrated in FIG. 13, the second outer side surface 72 is flush with the second outer side surface 341C of the second additional conductive portion 34C.

Next, a method of manufacturing an optical device A1 according to the present embodiment will be described with reference to FIGS. 15 and 18. In the present embodiment, a case where a plurality of optical devices A1 are manufactured will be described as an example. In the following description, the same or similar components as those described above will be given the same reference numerals.

First, a rectangular substrate 100 (see FIG. 15) is prepared. The substrate 100 has a size capable of forming the substrate 1 illustrated in FIG. 1 and the like in a plural number. The substrate 100 is made of the same material (i.e., glass epoxy resin) as the material of the substrate 1 described above. Next, a conductive layer 3 is formed over the substrate 100. The conductive layer 3 includes a portion 34M. The portion 34M is connected to a first conductive section 31A and a third conductive portion 32C. The portion 34M later becomes a first additional conductive portion 34A and a second additional conductive portion 34C. Also, at this time, a section 381 and a section 382 as illustrated in FIGS. 9 and 10 are formed. The portion 34M secures a conduction path between the first conductive section 31A and the third conductive portion 32C, for forming plating.

Figure 16:
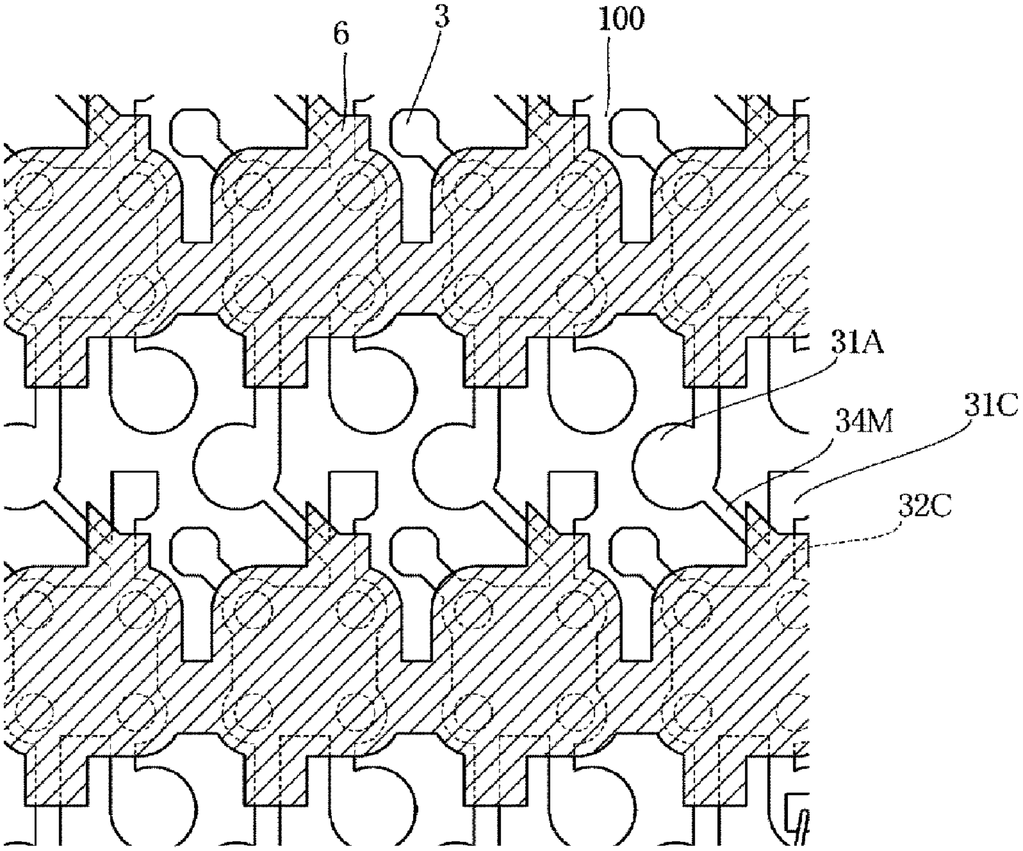
FIG. 16 is a plan view illustrating one process of a method of manufacturing an optical device according to the first embodiment.

Next, as illustrated in FIG. 16, an insulating layer 6 is formed over the substrate 100 on which the conductive layer 3 is formed. For example, a film-shaped resist may be adhered to the substrate 100 by pressing, or a paste-shaped resist may be applied. Subsequently, although not illustrated, sections 383 and 384 as illustrated in FIGS. 9 and 10 and the like are formed.

Figure 17:
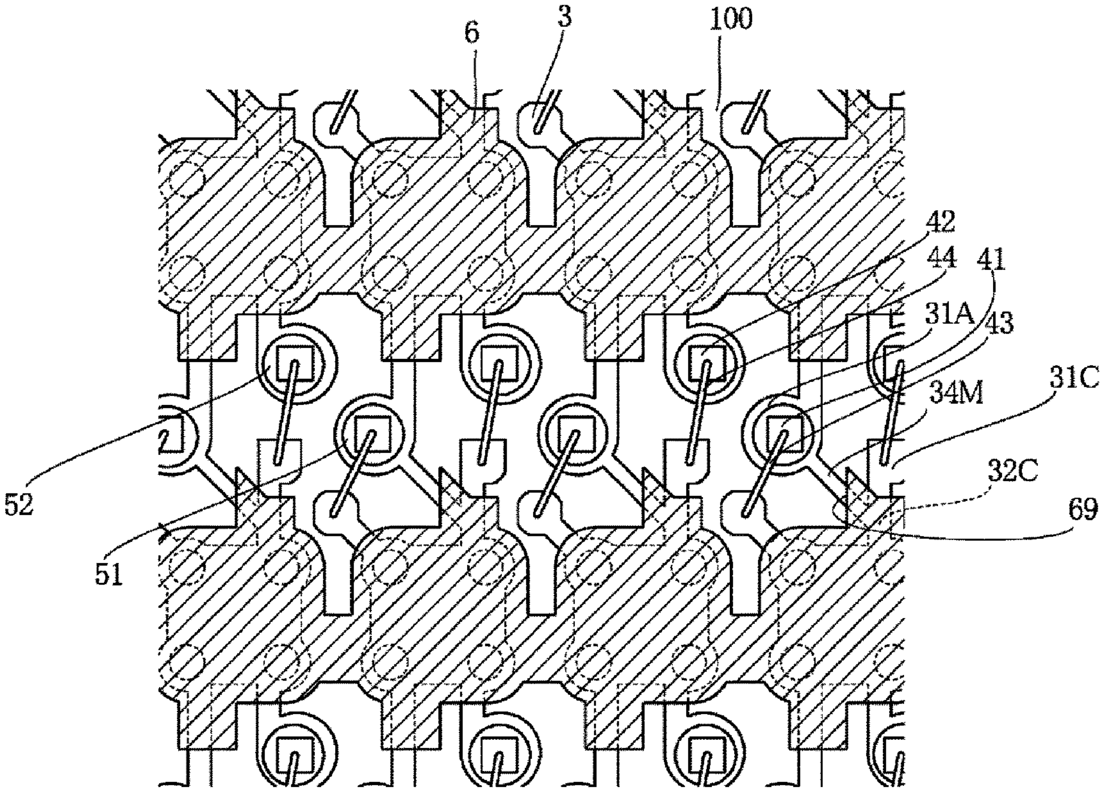
FIG. 17 is a plan view illustrating one process of a method of manufacturing an optical device according to the first embodiment.

Next, as illustrated in FIG. 17, a first optical element 41 and a second optical element 42 are disposed over the conductive layer 3 with a first junction layer 51 and a second junction layer 52 respectively interposed therebetween. Subsequently, a first wire 43 is bonded to the first optical element 41 and the conductive layer 3. Similarly, a second wire 44 is bonded to the second optical element 42 and the conductive layer 3.

Figure 18:
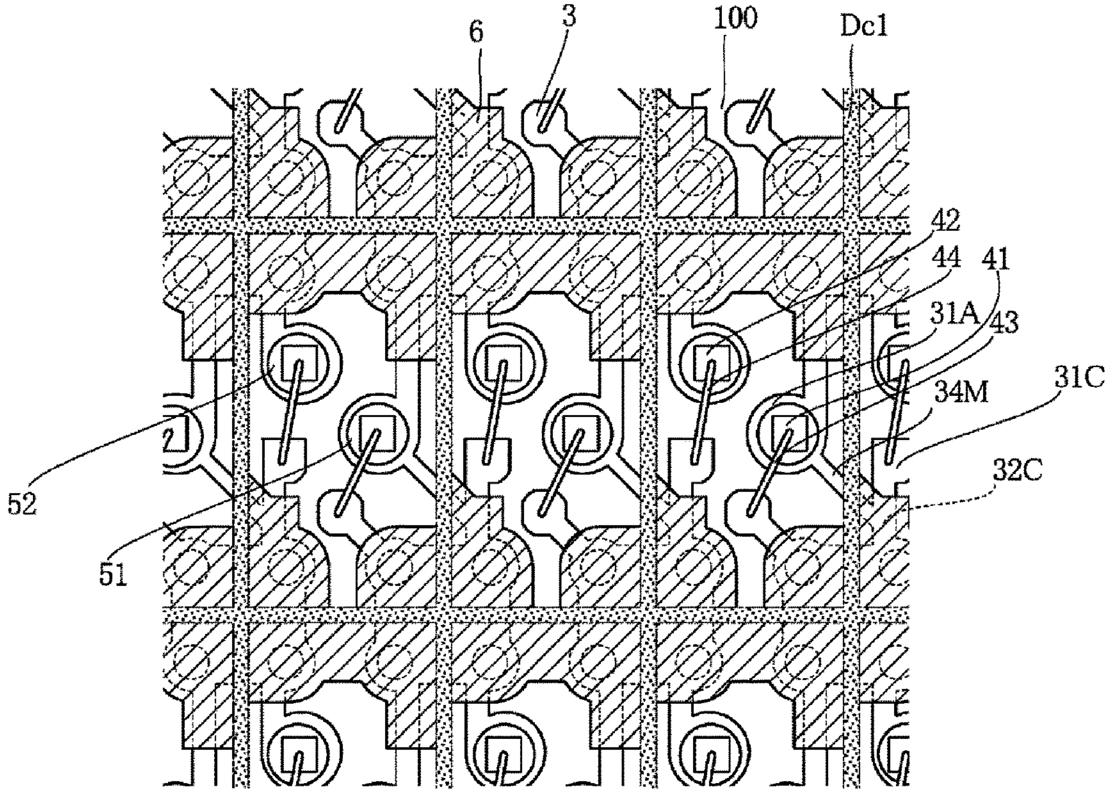
FIG. 18 is a plan view illustrating one process of a method of manufacturing an optical device according to the first embodiment.

Next, as illustrated in FIG. 18, the sealing resin part 7 as described above is formed by mode molding and then an intermediate product having the sealing resin part 7 formed thereon is diced along a line Dc1 to manufacture the optical device A1 as illustrated in FIG. 1 and the like in a plural number. Furthermore, in the method of manufacturing the optical device A1, the case where a plurality of optical devices A1 are manufactured has been described as an example, but they may be manufactured one by one.

Next, an operation and effect of the present embodiment will be described.

In the present embodiment, the insulating layer 6 includes a first insulating part 61A formed over the first conductive portion 32A, in which the first insulating part 61A has a portion overlapping with the second conductive section 31B in the first direction X1. With this configuration, more regions in the conductive layer 3 can be covered with the insulating layer 6. The conductive layer 3 and the sealing resin part 7 are difficult to be adhered to each other, as compared with the insulating layer 6 and the sealing resin part 7. Therefore, according to the present embodiment, it is possible to prevent the first optical element 41 adhered to the sealing resin part 7 from being desorbed from the first conductive section 31A as the sealing resin part 7 is desorbed from the conductive layer 3. For the same reason, it is possible to prevent the second optical element 42 from being desorbed from the second conductive section 31B.

If the edge 611A is located on the first conductive section 31A, the region where the sealing resin part 7 adheres to the insulating layer 6 becomes excessively large and thus the first optical element 41 becomes difficult to be desorbed from the first conductive section 31A. As a result, a crack may occur at a position near the first optical element 41A in the sealing resin part 7. In the present embodiment, the edge 611A of the first insulating part 61 A is located closer to the first direction X1 side than the first conductive section 31A. With the configuration, it is possible to suppress the occurrence of the crack in the sealing resin part 7. Furthermore, when the edge of the first insulating part 61A is located at the position 611A, 611B, or 611C in FIG. 5, stress concentration on the first optical element 41 can be suppressed, having an effect such that the first optical element 41 becomes difficult to be desorbed from the first conductive section 31A.

In the present embodiment, the first insulating part 61A has a portion overlapping with the second junction layer 52 in the first direction X1. With this configuration, more regions in the conductive layer 3 can be covered with the insulating layer 6. As a result, it is possible to suppress the first optical element 41 from being desorbed from the first conductive section 31A. For the same reason, it is possible to suppress the second optical element 42 from being desorbed from the second conductive section 31B.

In the present embodiment, the first insulating part 61A has a portion overlapping with the second optical element 42 in the first direction X1. With this configuration, more regions in the conductive layer 3 can be covered with the insulating layer 6. As a result, it is possible to suppress the first optical element 41 from being desorbed from the first conductive section 31A. For the same reason, it is possible to suppress the second optical element 42 from being desorbed the second conductive section 31B.

In the present embodiment, the conductive layer 3 includes the first additional conductive portion 34A extending from the first conductive section 31A. The first additional conductive portion 34A reaches the first side surface 15A as viewed in the thickness direction Z1 of the substrate 1. With this configuration, the heat generated from the first optical element 41 is likely to be released to the outside of the optical device A1 via the first additional conductive portion 34A. This makes it possible to prevent the first optical element 41 from reaching an excessively high temperature.

In the present embodiment, the conductive layer 3 includes the second additional conductive portion 34C extending from the third conductive section 31C or the third conductive portion 32C. The second additional conductive portion 34C reaches the second side surface 15B as viewed in the thickness direction Z1 of the substrate 1. With this configuration, the heat generated from the second optical element 42 is likely to be released to the outside of the optical device A1 via the second wire 44 and the second additional conductive portion 34C. This makes it possible to prevent the second optical element 42 from reaching an excessively high temperature.

In the present embodiment, the first additional conductive portion 34A extends in a direction different from the first direction X1 and the second direction Y1 as viewed in the thickness direction Z1 of the substrate 1. With this configuration, it is possible to make the first additional conductive portion 34A longer. This makes it possible to prevent moisture from reaching the first conductive section 31A or the first optical element 41 from the outside of the optical device A1 via the first additional conductive portion 34A.

In the present embodiment, the second additional conductive portion 34C extends in a direction different from the first direction X1 and the second direction Y1 as viewed in the thickness direction Z1 of the substrate 1. With this configuration, it is possible to make the second additional conductive portion 34C longer. This makes it possible to prevent moisture from reaching the third conductive section 31C or the second wire 44 from the outside of the optical device A1 via the second additional conductive portion 34C.

Figure 15:
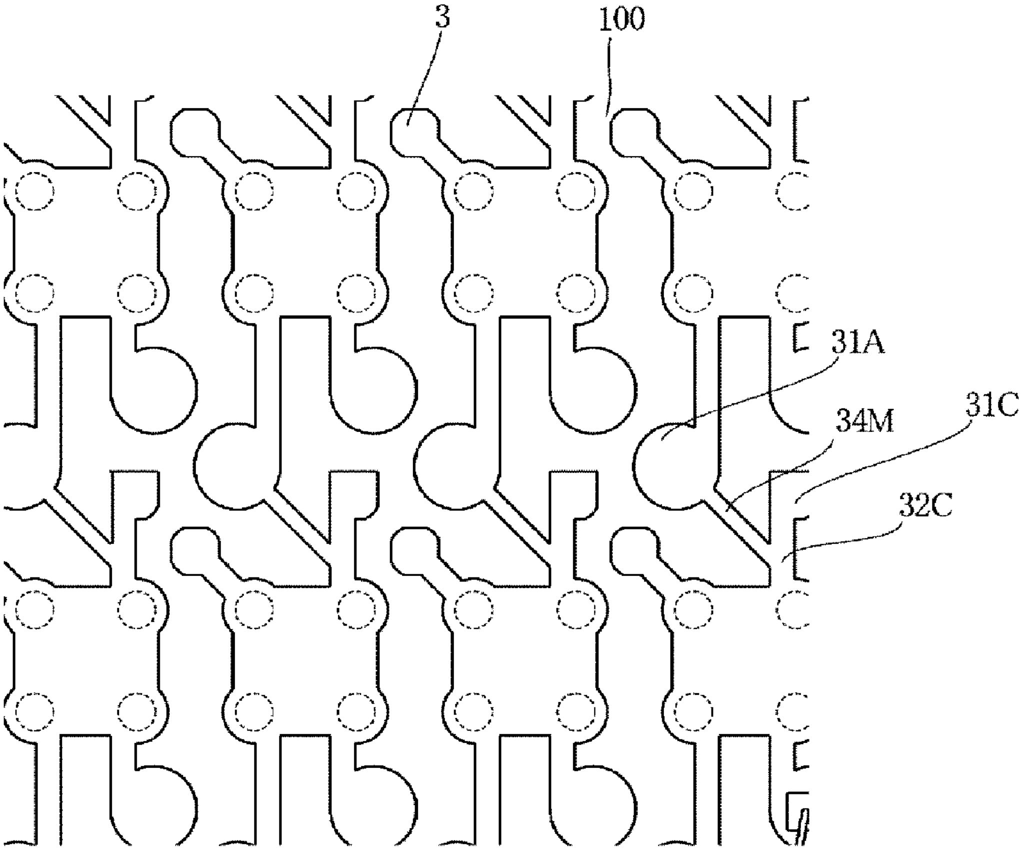
FIG. 15 is a plan view illustrating one process of a method of manufacturing an optical device according to the first embodiment.

In FIG. 15, the portion 34M is not connected to the third conductive section 31C but is connected to the third conductive portion 32C. Thus, at the time of manufacturing the optical device A1, it is possible to prevent a paste (which becomes the first junction layer 51 later) disposed over the first conductive section 31A from reaching the third conductive section 31C via the portion 34M. As a result, it is possible to suitably bond the second wire 44 to the third conductive section 31C.

In FIG. 17, an edge 69 of the insulating layer 6 is located on the portion 34M. Thus, although the paste has been reached via the portion 34M at the time of manufacturing the optical device A1, it is possible to stop the paste at the edge 69.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An optical device, comprising:
- a substrate;
- a conductive layer formed over the substrate and including:
  - a first conductive section;
  - a second conductive section spaced apart from the first conductive section; and
  - a first conductive portion extending in a first direction from the first conductive section;
- an insulating layer formed over the conductive layer;
- a first optical element disposed over the conductive layer;
- a second optical element disposed over the conductive layer
- a first junction layer interposed between the first optical element and the first conductive section;
- a second junction layer interposed between the second optical element and the second conductive section; and
- a sealing resin part configured to cover the first optical element,
- wherein the first optical element is disposed over the first conductive section,
- wherein the second optical element is disposed over the second conductive section,
- wherein the first conductive portion is spaced apart from the second conductive section in a second direction intersecting with the first direction,
- wherein the insulating layer includes a first insulating part formed over the first conductive portion, and the first insulating part includes a portion overlapping with the second conductive section in the first direction, and
- wherein the first insulating part includes a portion overlapping with the second junction layer in the first direction.

2. The device of claim 1, wherein the first insulating part includes a portion overlapping with the second optical element in the first direction.

3. The device of claim 1, wherein the substrate includes a first side surface and a second side surface spaced apart from the first side surface in the second direction, and the first side surface and the second side surface face opposite sides,
- wherein the conductive layer includes a first additional conductive portion extending from the first conductive section, and
- wherein the first additional conductive portion reaches the first side surface as viewed in a thickness direction of the substrate.

4. The device of claim 3, wherein the first additional conductive portion extends in a direction different from the first direction and the second direction as viewed in the thickness direction of the substrate.

5. The device of claim 3, wherein the first additional conductive portion is exposed from the insulating layer.

6. The device of claim 3, wherein the first additional conductive portion includes a first outer side surface that is flush with the first side surface.

7. The device of claim 3, wherein the conductive layer includes a second conductive portion extending from the second conductive section.

8. The device of claim 7, wherein the conductive layer includes a third conductive section spaced apart from the first conductive section and the second conductive section and a third conductive portion extending from the third conductive section to an opposite side of the second conductive section, and
- wherein the insulating layer includes a second insulating part formed over the third conductive portion.

9. The device of claim 8, wherein the conductive layer includes a second additional conductive portion extending from the third conductive section or the third conductive portion, and
- wherein the second additional conductive portion reaches the second side surface as viewed in the thickness direction of the substrate.

10. The device of claim 9, wherein the second additional conductive portion extends in the same direction as a direction in which the first additional conductive portion extends as viewed in the thickness direction of the substrate.

11. The device of claim 9, wherein the second additional conductive portion is exposed from the insulating layer.

12. The device of claim 9, wherein the second additional conductive portion includes a second outer side surface that is flush with the second side surface, and wherein both the second outer side surface of the second additional conductive portion and a first outer side surface of the first additional conductive portion are located on the same side as viewed in the thickness direction with respect to a virtual line extending along the second direction and passing through a center of the substrate as viewed in the thickness direction.

13. The device of claim 9, wherein the insulating layer is formed over the second additional conductive portion.

14. The device of claim 1, further comprising:

a first wire bonded to the first optical element; and a second wire bonded to the second optical element.

15. An optical device, comprising:

a substrate;

a conductive layer formed over the substrate and including:

a first conductive section;

a second conductive section spaced apart from the first conductive section;

a first conductive portion extending in a first direction from the first conductive section; and a second conductive portion extending in the first direction from the second conductive section and spaced apart from the first conductive section in a second direction intersecting with the first direction;

an insulating layer formed over the substrate and formed as a single body over the first conductive portion and the second conductive portion;

a first optical element disposed over the first conductive section of the conductive layer; and a sealing resin part configured to cover the first optical element, wherein the insulating layer includes a portion overlapping with the second conductive section in the first direction.

16. The device of claim 15, further comprising a second optical element disposed over the conductive layer, wherein the second optical element is disposed over the second conductive section.

17. The device of claim 16, wherein the substrate includes a first side surface and a second side surface spaced apart from the first side surface in the second direction, and the first side surface and the second side surface face opposite sides, wherein the conductive layer includes a first additional conductive portion extending from the first conductive section, and wherein the first additional conductive portion reaches the first side surface as viewed in a thickness direction of the substrate.

18. The device of claim 17, wherein the first additional conductive portion extends in a direction different from the first direction and the second direction as viewed in the thickness direction of the substrate.

19. The device of claim 17, wherein the first additional conductive portion is exposed from the insulating layer.

20. The device of claim 17, wherein the conductive layer includes a third conductive section spaced apart from the first conductive section and the second conductive section and a third conductive portion extending from the third conductive section to an opposite side of the second conductive section.

21. The device of claim 20, wherein the conductive layer includes a second additional conductive portion extending from the third conductive section or the third conductive portion, and wherein the second additional conductive portion reaches the second side surface as viewed in the thickness direction of the substrate.

22. The device of claim 21, wherein the second additional conductive portion extends in the same direction as a direction in which the first additional conductive portion extends as viewed in the thickness direction of the substrate.

23. The device of claim 21, wherein the second additional conductive portion is exposed from the insulating layer.

24. The device of claim 21, wherein the insulating layer is formed over the second additional conductive portion.

* * * * *